US006619123B2

(12) United States Patent
Gianchandani et al.

(10) Patent No.: US 6,619,123 B2
(45) Date of Patent: Sep. 16, 2003

(54) MICROMACHINED SHOCK SENSOR

(75) Inventors: Yogesh B. Gianchandani, Madison, WI (US); Shamus P. McNamara, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1 day.

(21) Appl. No.: 09/873,791

(22) Filed: Jun. 4, 2001

(65) Prior Publication Data

US 2002/0184949 A1 Dec. 12, 2002

(51) Int. Cl.[7] .............................................. G01P 15/10
(52) U.S. Cl. ........................ 73/514.29; 73/514.32; 73/514.36; 73/504.04
(58) Field of Search ..................... 73/514.29, 514.32, 73/514.17, 514.18, 514.38, 514.01, 514.16, 514.21, 514.36

(56) References Cited

U.S. PATENT DOCUMENTS

| 4,189,655 | A | * | 2/1980 | Bruel ........................ 310/329 |
|---|---|---|---|---|
| 4,945,765 | A | * | 8/1990 | Roszhart .................. 73/514.29 |
| 5,206,983 | A | | 5/1993 | Guckel et al. ................ 29/598 |
| 5,378,583 | A | | 1/1995 | Guckel et al. .............. 430/325 |
| 5,392,650 | A | * | 2/1995 | O'Brien et al. .......... 73/514.18 |
| 5,447,051 | A | * | 9/1995 | Hanks et al. ................. 73/1 D |
| 5,610,337 | A | * | 3/1997 | Nelson .................... 200/61.46 |
| 5,656,778 | A | * | 8/1997 | Roszhart .................. 73/504.04 |
| 5,874,675 | A | * | 2/1999 | Edmans et al. .......... 73/514.21 |
| 5,948,981 | A | * | 9/1999 | Woodruff .................. 73/514.29 |
| 5,978,722 | A | * | 11/1999 | Takasuka et al. ........... 180/282 |
| 6,023,664 | A | * | 2/2000 | Bennet ........................ 702/141 |
| 6,032,531 | A | * | 3/2000 | Roszhart .................. 73/504.04 |
| 6,035,714 | A | * | 3/2000 | Yazdi et al. .............. 73/514.32 |
| 6,038,924 | A | * | 3/2000 | Lee et al. ................. 73/514.34 |
| 6,078,016 | A | | 6/2000 | Yoshikawa et al. .......... 200/181 |
| 6,119,520 | A | * | 9/2000 | Woodruff ...................... 438/52 |
| 6,199,430 | B1 | | 3/2001 | Kano et al. ............... 73/514.32 |
| 6,220,096 | B1 | * | 4/2001 | Gutierrez et al. ......... 73/514.21 |
| 6,236,005 | B1 | * | 5/2001 | Kvisteroey et al. .. 200/61.45 M |
| 6,248,610 | B1 | * | 6/2001 | Leonardson et al. .......... 438/50 |
| 6,308,554 | B1 | * | 10/2001 | Mattes et al. ................. 73/1.37 |
| 6,308,569 | B1 | * | 10/2001 | Stewart ....................... 361/280 |

FOREIGN PATENT DOCUMENTS

EP 0981052 2/2000
JP 2000155126 6/2000

OTHER PUBLICATIONS

Wolf D. Frobenius, et al. "Microminiature Ganged Threshold Accelerometers Compatible with Integrated Circuit Technology," IEEE Trans. on Electron Devices, vol. ED–19, No. 1, Jan. 1972, pp. 37–40.

(List continued on next page.)

Primary Examiner—Hezron Williams
Assistant Examiner—Jacques Saint-Surin
(74) Attorney, Agent, or Firm—Foley & Lardner

(57) ABSTRACT

A micromachined shock sensor has a substrate with a surface on which are formed an array of acceleration sensing units. Each sensing unit has a mount fixed to the substrate, a cantilever beam extending from the mount, and a proof mass fixed to the cantilever beam and supported above the substrate to permit translation of the proof mass and bending of the cantilever beam in a plane parallel to the substrate surface. Sensing electrodes are formed on the substrate on opposite sides of the proof mass such that displacement of the proof mass in response to acceleration brings the proof mass into contact with one or the other of the electrodes at a sufficient acceleration level, effectively closing a switch and providing an electrical output signal that can be detected. The multiple acceleration sensing units are formed to make contact at different levels of acceleration, allowing the shock sensor to allow measurements over a range of accelerations. A test electrode may be formed adjacent to the proof mass to allow the proof mass to be electrostatically drawn toward and into contact with one of the sensing electrodes to allow testing of the level of acceleration required to make contact in a particular acceleration sensing unit.

29 Claims, 4 Drawing Sheets

OTHER PUBLICATIONS

Lynn Michelle Roylance, et al., "A Batch–Fabricated Silicon Accelerometer," IEEE Trans. Electron Devices, vol. ED–26, No. 12, Dec. 1979, pp. 1911–1917.

C. Robinson, et al., "Problems Encountered in the Development of a Microscale g–switch Using Three Design Approaches," Transducers '87, 1987, pp. 410–413.

Y. Loke, et al., "Fabrication and Characterization of Silicon Micromachined Threshold Accelerometers," Sensors and Actuators A, vol. 29, 1991, pp. 235–240.

C. Burbaum, et al., "Fabrication of Capacitive Acceleration Sensors by the LIGA Technique," Sensors and Actuators A., vol. 25–27, 1991, pp. 559–563.

Dino R. Ciarlo, "A Latching Accelerometer Fabricated by the Anisotropic Etching of (110) Oriented Silicon Wafers," J. Micromech. Microeng., vol. 1, 1992, pp. 10–13.

P. F. Mann, et al., "Surface Micromachined Shock Sensor for Impact Detection," Solid–State Sensor and Actuator Workshop, Hilton Head, South Carolina, Jun. 13–16, 1994, pp. 156–159.

Jeung Sang Go., et al., "Acceleration Microswitches with Adjustable Snapping Threshold," Transducers '95–Eurosensors IX, The 8th International Conference on Solid–State Sensors and Actuators, and Eurosensors IX, Stockholm, Sweden, Jun. 25–29, 1995, pp. 691–694.

A. Selvakumar, et al., "Low Power, Wide Range Threshold Acceleration Sensing System," IEEE MEMS '96, 1996, pp. 186–191.

Xi–Quing Sun, et al., "A Surface Micromachined Latching Accelerometer," Transducers '97, 1997 International Conference on Solid–State Sensors and Actuators, Chicago, IL, Jun. 16–19, 1997, pp. 1189–1192.

H. Guckel, "High–Aspect Ratio Micromachining Via Deep X–Ray Lithography," Proceedings of the IEEE, vol. 86, No. 8, Aug. 1998, pp. 1586–1593.

\* cited by examiner

MICROMACHINED SHOCK SENSOR

This invention was made with United States government support awarded by the following agencies: DOD. DAAH01-00-C-R104. The United States has certain rights in this invention.

FIELD OF THE INVENTION

This invention pertains generally to the field of micro-electro-mechanical systems and to accelerometers and shock sensors.

BACKGROUND OF THE INVENTION

Accelerometers are one of the most significant applications of micro-mechanics and have been the subject of active research for more than two decades. See, e.g., L. M. Roylance, et al., "A Batch-Fabricated Silicon Accelerometer" IEEE Trans. Elec. Dev., ED-26, 1979, pp. 1911–1917. Shock sensors are accelerometers which are designed to respond to specific threshold levels of acceleration. A typical design for a shock sensor includes a proof mass supported by a flexible suspension. Generally, at a pre-selected level of acceleration, the resulting deflection of the proof mass will cause it to contact an electrical element to close a switch, much like a relay. Since each sense element triggers at a single threshold, it is necessary to use arrays of sense elements to cover a wide dynamic range. The discrete outputs generated permit these devices to operate with a relatively simple interface circuit, which can be designed to have minimal power dissipation. An example is described in A. Selvakumar, et al. "Low Power, Wide Range Threshold Acceleration Sensing System," IEEE MEMS '96 pp. 186–191. Low power dissipation permits long term operation from a small battery. One potential application for such devices is for use with environmental monitoring systems of the type which monitor temperature, pressure, humidity and a number of other variables, and which are kept normally in a sleep mode to preserve battery life. The shock sensors can be utilized to wake up the environmental monitoring system when a shock is detected. Other potential applications for shock sensors include air bag deployment systems, munitions arming, monitoring of seismic activity, and monitoring of shocks imposed on fragile shipments.

In most shock sensor designs, the proof mass returns to its rest position once the acceleration is removed. Devices in which the deflection is latched have also been reported. See R. Ciarlo, "A Latching Accelerometer Fabricated by the Anisotropic Etching of (110) Oriented Silicon Wafers," J. Micromech. Microeng., Vol. 2, 1992, pp. 10–13; X.-Q. Sun, et al., "A Surface Micromachined Latching Accelerometer," Transducers '97, pp. 1189–92. Such latching devices may be useful for certain applications, but with some limitations on sensitivity and reusability.

Prior micromachined shock sensors have typically detected out-of-plane accelerations. One substrate-plane sensing device has been reported, but targeting very high g-forces. P. F. Man, et al., "Surface Micromachined Shock Sensor for Impact Detection," Solid-State Sensor and Actuator Workshop, Hilton Head, N.C., 1994, pp. 156–159. In general, substrate-plane sensing is desirable since it will simplify mounting and alignment and can also simplify bidirectional sensing (i.e., along the positive and negative direction of the sense axis) because electrodes can be in the same plane as the proof mass and only one structural and electrical area is required.

A persistent challenge for micromachined shock sensors has been the closing and opening of the electrical contacts. See, e.g., Y. Loke, et al., "Fabrication and Characterization of Silicon Micromachined Threshold Accelerometers," Sensors & Actuators A, Vol. 29, 1991, pp. 235–240; A. Selvakumar, supra. If the proof mass is very small, its momentum may fail to break through surface films that may inadvertently form on the electrical contact. In addition, if the suspension for the proof mass is too weak, forces established during contact may prevent the retraction of the proof mass.

SUMMARY OF THE INVENTION

In accordance with the invention, a micromachined shock sensor is provided which can be formed with dimensions of a few millimeters on a side or less in an efficient and cost-effective manner. The shock sensor can be utilized to provide discrete output signals indicating acceleration levels over a wide range of accelerations with accuracy and repeatability.

A shock sensor in accordance with the invention capable of detecting multiple levels of acceleration includes a substrate having a surface on which are formed an array of acceleration sensing units. Each sensing unit comprises a mount fixed to the substrate, a cantilever beam extending from the mount over the substrate surface and free to bend in a plane above the substrate surface, and a proof mass fixed to the cantilever beam and supported by the cantilever beam above the surface of the substrate to permit translation of the proof mass and bending of the cantilever beam in a plane parallel to the substrate surface. First and second sensing electrodes are formed on the substrate on opposite sides of the proof mass and adjacent to the proof mass and have contact elements that are spaced by a sensing gap from the proof mass. Displacements of the proof mass in response to accelerations brings the proof mass into contact with one or the other of the electrodes at a sufficient acceleration level. Several sensor units have cantilever beam dimensions and proof mass dimensions that are selected to provide contact between the proof mass and the adjacent sensing electrodes at different levels of acceleration. An electrical conductor is formed on the substrate electrically connected to all of the first sensing electrodes and an electrical conductor is formed on a substrate that is electrically to all of the second sensing electrodes. The various levels of acceleration may be detected by applying appropriate voltages (e.g., positive and negative DC voltages) to the first and second sensing electrodes and then detecting any voltage that is applied to the proof mass as it makes contact with a sensing electrode, preferably by making an electrical connection to the mount connected by a conductive cantilever beam to the conductive proof mass.

The acceleration sensing units may further include a test electrode formed on the substrate adjacent to the proof mass on one side thereof and adjacent to the first sensing electrode. Application of a voltage between the test electrode and the proof mass electrostatically draws the proof mass toward the test electrode until, at a sufficient voltage, the proof mass contacts the first sensing electrode. The test electrode may be electrically connected to the second sensing electrodes so that a common electrical connection may be provided to both the second sensing electrodes and to the test electrodes.

The mount, cantilever beam, proof mass, sensing electrodes and test electrodes may be formed on the substrate surface of electroplated metal by micromechanical manufacturing processes. The mount, cantilever beam and proof mass are preferably integrally formed together of electrically conductive material, and the proof mass and cantilever beam preferably have the same height. The microstructural elements preferably have a height of 500 μm or less and occupy an area on the substrate of less than about one square centimeter.

Further objects, features and advantages of the invention will be apparent from the following detailed description when taken in conjunction with the accompanying drawings.

DETAILED DESCRIPTION OF THE INVENTION

Figure 1:
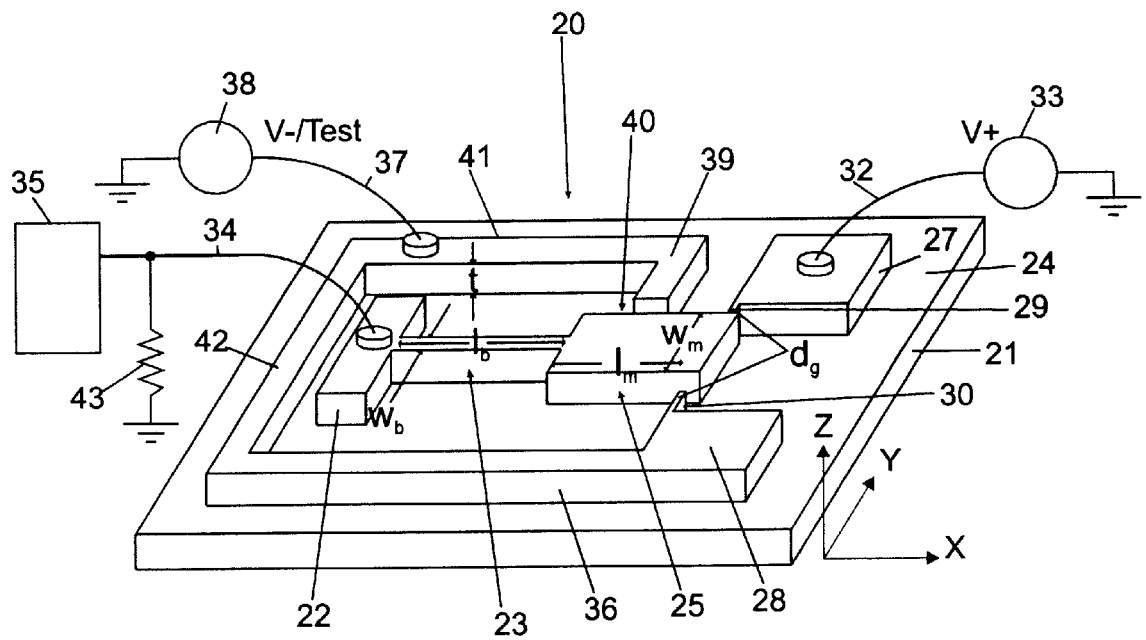
FIG. 1 is a simplified perspective view of a single acceleration sensing unit in accordance with the invention.

A simplified view of a single acceleration sensing unit that may be utilized the invention is shown generally at 20 in FIG. 1. The sensing unit 20 is formed on a substrate 21 and includes a mount 22 secured to the substrate, a cantilever beam suspension 23 which extends from the mount 22 over the surface 24 of the substrate 21 and out of contact therewith, and a proof mass 25 which is fixed to and supported at the end of the cantilever beam suspension 23. The proof mass 25, beam 23 and mount 22 are preferably formed of an electrically conductive material (e.g., various metals) and are electrically connected together (e.g., by being formed integrally). The beam 23 has a much greater height (i.e., the dimension of the beam in a direction perpendicular to the substrate surface) than width, and supports the proof mass 25 above the substrate surface 24 with minimal bending toward or away from the surface 24 while allowing bending of the beam 23 and translation of the mass 25 in a plane parallel to the substrate surface. First and second sensing electrodes 27 and 28 are formed on the substrate 21 on opposite sides of the proof mass and have contact elements 29 and 30, respectively, which are adjacent to edges of the proof mass 25 and are separated therefrom in the normal position of the proof mass by selected sense gaps. Although the contact elements 29 and 30 preferably extend inwardly (toward the proof mass) from the rest of the electrodes 27 and 28 as shown in FIG. 1, the contact elements may simply be a flat wall of the electrodes 27 and 28 or may have any other desired shape appropriate for electrical contacts. The first sensing electrode 27 may be connected by a conductor 32 to a (e.g., positive DC voltage) power source 33, and the mount 22 may be connected by a conductor 34 to detector circuitry 35. The sense electrode 28 is connected to a conducting line 36 formed on the substrate, and a conductor 37 is electrically connected to the conductor 36 which extends to a (e.g., negative DC voltage) voltage source 38. As illustrated in FIG. 1, a positive voltage may be applied by the voltage source 33 via the conductor 32 to the electrode 27 and a negative voltage may be applied to the electrode 28 by the voltage source 38 via the conductor 37. A test electrode pad 39 is formed on the substrate 21 and has a face 40 adjacent to the proof mass 25 and separated therefrom by a test gap. The test electrode 39 is electrically connected by a conducting line 41 formed on the substrate to a main conducting line 42 that is also connected to the conductor 37 and thus has the voltage from the voltage source 38 applied thereto. The face 40 of the test electrode pad 39 is spaced sufficiently far from the proof mass 25 that the proof mass 25 contacts the contact element 29 and is stopped by it before it makes contact with the face 40 of the test electrode pad 39.

The proof mass 25 at the end of the cantilever beam 23 can move in a plane parallel to the substrate surface 24 when subject to an acceleration having a component in the plane of motion and perpendicular to the length of the beam 23. When the mass 25 closes the sense gap it makes electrical contact with one of the two nearby pick-off electrode contact elements 29 or 30, depending on the direction of the acceleration force, allowing detection of a level of acceleration at or above a selected threshold level. The detector circuit reads the voltage on the proof mass, which is biased to ground through a resistor 43. For example, the detector circuit may comprise a group of timers (e.g., 555 times) that are each individually connected to a conductor 34 to receive and trigger off the electrical pulses when the proof masses make contact to provide a timed output voltage. The sensing electrodes 27 and 28 are preferably biased with voltages of opposite polarity, as shown, to allow a simple determination of the direction of acceleration. Any other technique for distinguishing the direction of acceleration may be utilized, such as voltage sources with different voltage levels, alternating voltage versus direct voltage, AC voltages of different frequencies, etc. The self test electrode 39 permits the proof mass 25 to be deflected electrostatically when a large enough (e.g., negative) voltage is applied to the electrode 39. The gap between the face 40 of the test electrode 39 and the mass 25 is relatively large, and the motion of the proof mass 25 is stopped by the contact element 29 of the positive sense electrode 27 before it comes into contact with the test electrode 39.

If the suspension beam 23 is assumed to be weightless and the proof mass is assumed to be rectangular and rigid, the acceleration threshold $\alpha_t$ at which contact recurs between the proof mass and a sensing electrode for a particular acceleration sensing unit 20 may be determined in accordance with the following design equation:

$$a_t = \frac{E w_b^3 d_g}{p w_m l_m l_b} \left[ \frac{1}{4 l_b^2 + 9 l_b l_m + 6 l_m^2} \right] \quad (1)$$

where E is Young's modulus of the beam, p is the density of the proof mass, $w_b$ and $l_b$ are the width and length of the beam suspension, $w_m$ and $l_m$ are the width and length of the proof mass 25, and $d_g$ is the width of the sense gap between the proof mass and the sensing electrodes. See L. M. Roylance, et al., supra. To verify the validity of this equation, a non-linear finite element analysis (FEA) was performed for sensing units designed to have acceleration thresholds $\alpha_t$=10 g and 150 g using ANSYS software with a solid92 element type. This analysis was found to agree with equation (1) to within 1% over the expected deflection range.

The calculated resonant frequency of the beam 23 and proof mass 25 system, which determines the bandwidth if there is little damping, is:

$$\omega_n \cong \sqrt{\frac{w_b^3 E}{12 p l_m w_m l_b^3} \cdot \frac{2 + 6f + f^2}{0.666 + 4f + 10.5f^2 + 14f^3 + 8f^4}} \quad (2)$$

where $f = |_m/2|_b$. This may be rewritten in terms of the threshold acceleration as:

$$\omega_n \cong \sqrt{\frac{a_1}{12d_g}} \sqrt{\frac{8 + 50f + 160f^2 + 162f^3 + 24f^4}{0.666 + 4f + 10.5f^2 + 14f^3 + 8f^4}} = g(f) \sqrt{\frac{a_t}{12d_g}} \quad (3)$$

For a given threshold acceleration $\alpha_t$ and sense gap $d_g$, the resonant frequency is maximized at f=0.3. For a fixed total length L and given threshold acceleration, the tip deflection is maximized when the beam length is 44.64% of the total length L. Since the resonant frequency is optimized for a beam length of 62.5% of the total length (beam and proof mass), a trade-off must be made during the design process.

Figure 2:
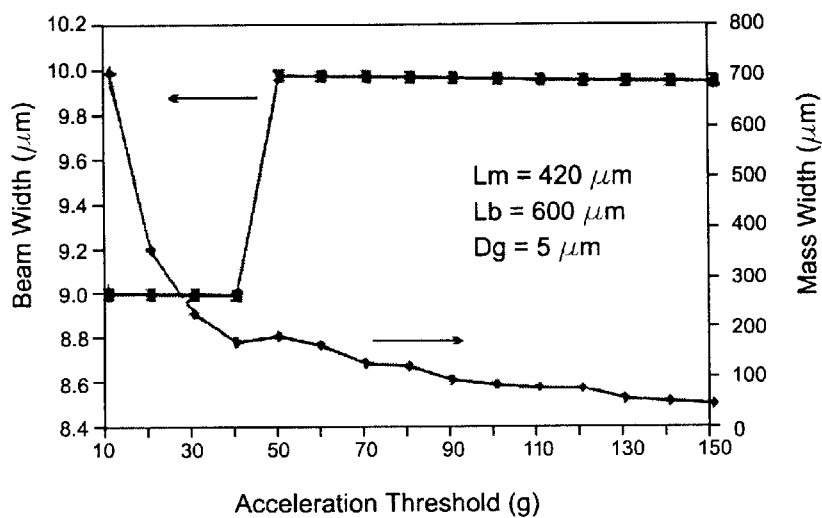
FIG. 2 are graphs illustrating the relationship between beam width and mass width with respect to acceleration threshold for an exemplary shock sensor comprising multiple acceleration sensing units capable of sensing 15 different levels of acceleration.
Figure 3:
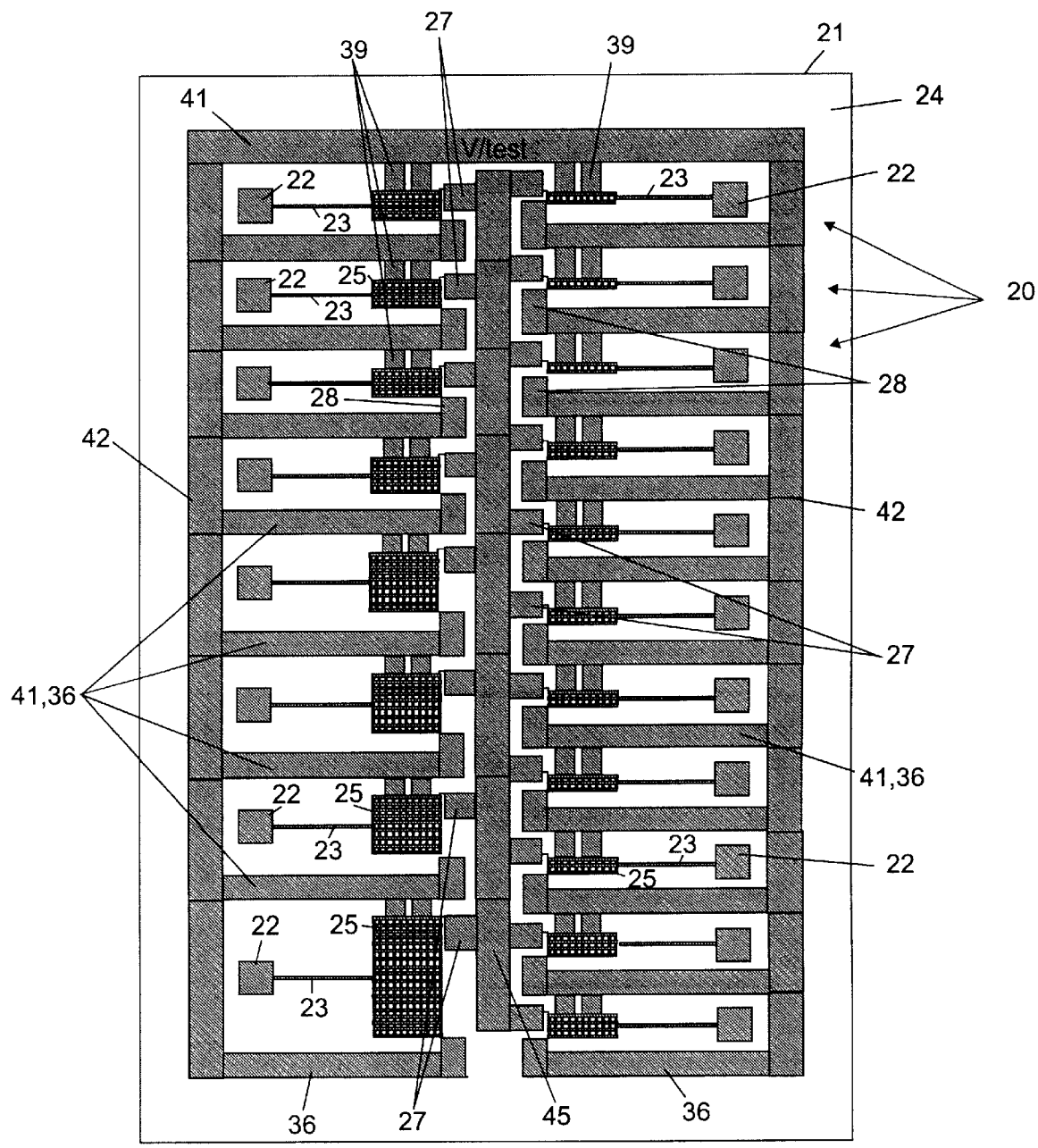
FIG. 3 is a plan view of an array shock sensor in accordance with the invention.

An exemplary array shock sensor in accordance with the invention is shown in FIG. 3 having multiple sensing units 20. A shock sensor as shown in FIG. 3 was constructed with lengths selected for the proof mass and beam of 420 μm and 600 μm, respectively, for all acceleration sensing units 20 in the array of units. For compactness of the structure, the total length of the cantilever beam and proof mass may preferably be 2500 μm or less. The cantilever beam width was 9 μm for the 10 g to 40 g sensing units and 10 μm for the higher g sensing units. The proof mass widths for the sensing units are selected to set the sensing unit to the threshold acceleration $\alpha_t$ selected for that sensing unit. The height of the proof mass 25 and support beam 23 above the substrate surface, typically 100–300 μm, and preferably less than about 500 μm, does not matter for the primary design criteria, but it does impact the z-axis sensitivity. The test electrodes 39 for the example structure were all 245 μm wide to facilitate comparison between sensing units. They are designed not to contact the proof mass, thus avoiding a large current flow that can fuse the contacts. See Y. Loke, supra. FIG. 2 shows the proof mass widths and cantilever beam widths of the fifteen different acceleration sensing units as a function of acceleration threshold of the device of FIG. 5 (with redundant units at 20 g and 100 g). The pin count is minimized by electrically connecting together in parallel all the first positive sensing electrodes 27 by a conducting line 45, and by connecting together in parallel all the second (negative) electrodes 28 by the main conductor 42, and by connecting together the test electrodes 39 via the conductors 41 to the main conductor 42. Only the proof masses 25 are individually connected at the mounts 22, by the lines 34 (not shown in FIG. 3), to the detector circuitry.

The example shock sensor was fabricated using a standard LIGA process to create Ni and Ni/Fe structures attached to the substrate. For a description of the LIGA process, see H. Guckel, "High-Aspect-Ratio Micromachining via Deep X-Ray Lithography," Proc. IEEE, Vol. 86, No. 8, 1998, pp. 1586–1593 and U.S. Pat. Nos. 5,206,983 and 5,378,583, incorporated by reference. Gold is then electroplated over the nickel. The gold plating on the proof mass 40 and on the electrodes 27 and 28 with contact elements 29 and 30 reduces the contact resistance of the surfaces of the proof mass and electrodes that make electrical contact. Finally, a copper sacrificial layer is time etched to free the proof mass 25 and suspension beams 23. The proof mass 25 was formed with a mesh structure with multiple openings through the metal to facilitate rapid etching away of the sacrificial layer under the proof mass. The anchor supports 22 are sufficiently large that they are not freed during the timed sacrificial etch (an etch time sufficient to free the proof mass). Wire bonding during packaging is done directly to the anchors. The design of FIG. 3 provides for convenient wire-bonding when inserted in a dual in-line (DIP) package. The footprint of the example die is 3680 μm×5670 μm. Preferably, the area occupied by the micromechanical elements on the substrate is about one cm² or less.

Both static and dynamic self-testing may be performed on the array shock sensors as shown in FIG. 3. The static test measures the pull-in voltage applied to the test electrode 39 that is required to deflect the proof mass sufficiently to trigger electrical contact between the proof mass and the sense electrode 27 adjacent to the test electrode. The dynamic test measures the time required for the proof mass to contact the first sensing electrode 27 after a step voltage is applied to the test electrode 39. Although simpler, the former test cannot discriminate between different proof mass sizes. The dynamic self-test is more complete, but requires a more challenging interpretation. The equation to find the actuation time is a non-linear second-order differential equation, but it is easily evaluated numerically.

Figure 4:
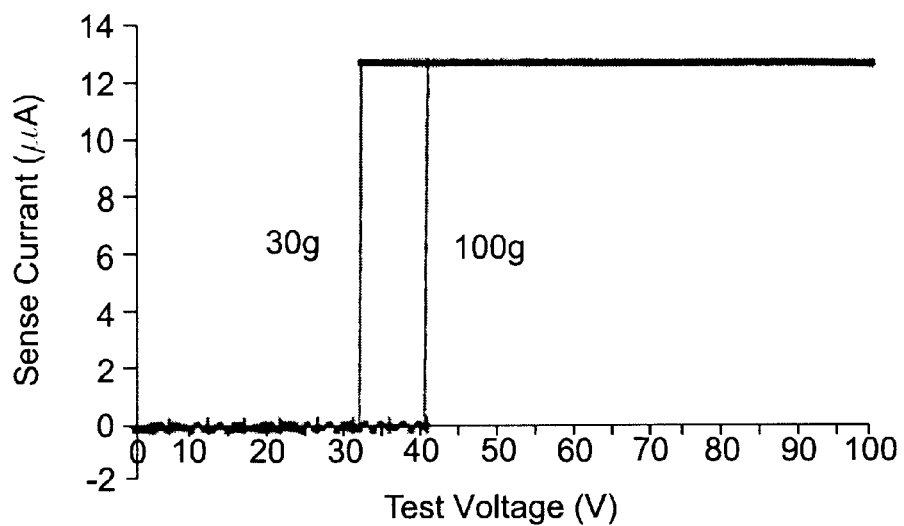
FIG. 4 are graphs illustrating the results of static self-test measurements for the 30 g sensing unit and the 100 g sensing unit of the shock sensor array of FIG. 3.

The static self-tests were carried out by ramping the voltage on the test electrode and electrically measuring when the proof mass makes contact with the pick-off electrode. The pick-off electrode was connected to a 5V bias, while the proof mass was grounded through a large resistor to minimize current flow. FIG. 4 shows the measured currents for static self-test measurements for the 30 g sensing unit and for the 100 g sensing unit, illustrating the greater voltage required for switching the 100 g unit.

Figure 5:
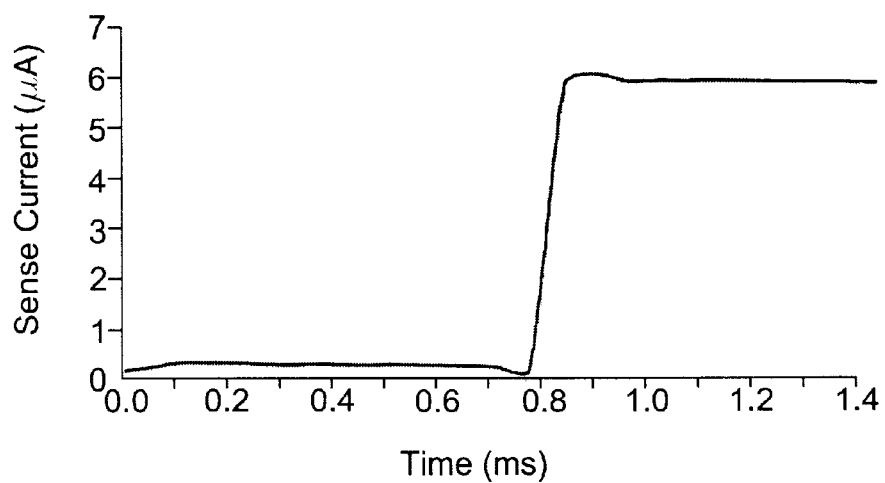
FIG. 5 is a graph illustrating the dynamic self-test measurement for a 100 g acceleration sensing unit in the shock sensor of FIG. 3.

Dynamic self-tests were performed using the same test setup as for the static self-tests, except the voltage was not ramped. Instead, the time interval is measured between application of a 100V step and when electrical contact was established between the proof mass and pick-off electrode. The trace of this measured current following application of the voltage steps is shown in FIG. 5 for the 100 g sensing unit. Batches of shock sensing devices can be individually calibrated by comparing such measurements for each device with measurements on a device which has been tested at known accelerations.

Figure 6:
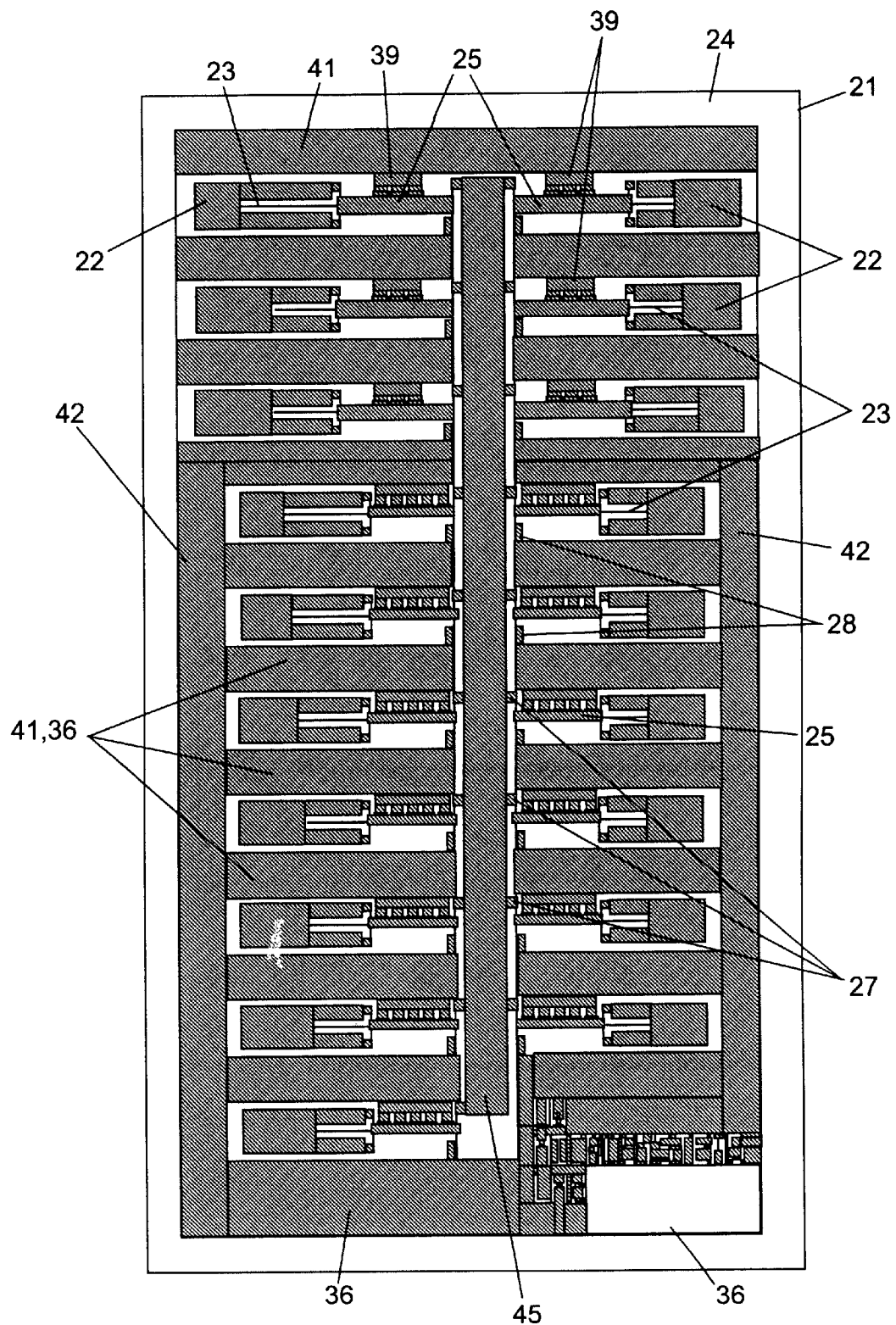
FIG. 6 is a plan view of another embodiment of a shock sensor having multiple acceleration units similar to the shock sensor of FIG. 3 but with different relative sizes for the structural elements.

FIG. 6 shows another version of the shock sensor of the invention, that may be fabricated similarly to the device of FIG. 3, which has a stiffer construction with relatively narrower proof masses 25 and that is resistant to twisting about the suspension beams 23. The proof masses 25 of FIG. 6 are solid, rather than the mesh structure of the proof masses of FIG. 3, but are formed sufficiently narrower than the anchor mounts 22 that the proof masses are released by etching away a sacrificial layer during a timed etch without releasing the anchor mounts. In other respects, the shock sensor of FIG. 6 functions in the same manner as the device of FIG. 3.

It is understood that although the utilization of test electrodes 39 is preferred, the array shock sensor may be constructed without the test electrodes.

It is further understood that the invention is not confined to the embodiments set forth herein as illustrative, but embraces all such forms thereof as come within the scope of the following claims.

What is claimed is:

1. A micromachined acceleration sensing unit comprising:
   (a) a substrate with a surface;
   (b) a mount fixed to the substrate;
   (c) a cantilever beam extending from the mount over the substrate surface and free to bend in a plane above the substrate surface;
   (d) a proof mass fixed to the cantilever beam and supported by the cantilever beam above the surface of the substrate to permit translation of the proof mass and bending of the cantilever beam in a plane parallel to the substrate surface, the mount, cantilever beam and proof mass being electrically conductive and in electrical contact;
   (e) first and second sensing electrodes formed on the substrate on opposite sides of the proof mass and adjacent to the proof mass and having contact elements thereof spaced by a sensing gap from the proof mass such that displacements of the proof mass in response to accelerations brings the proof mass into contact with one or the other of the contact elements of the electrodes at a sufficient acceleration level; and
   (f) a test electrode formed on the substrate adjacent to the proof mass on one side thereof such that application of a voltage between the test electrode and the proof mass draws the proof mass toward the test electrode until at a sufficient voltage the proof mass contacts the sensing electrode that is on the same side of the proof mass as the test electrode.

2. The acceleration sensing unit of claim 1 wherein the mount, cantilever beam, proof mass, sensing electrodes, and test electrodes are formed on the substrate surface of electroplated metal.

3. The acceleration sensing unit of claim 1 wherein the mount, cantilever beam and proof mass are integrally formed together.

4. The acceleration sensing unit of claim 3 wherein the cantilever beam and proof mass have the same height.

5. The acceleration sensing unit of claim 1 wherein the cantilever beam and proof mass together have a total length of 2500 µm or less.

6. The acceleration sensing unit of claim 1 including a positive voltage source connected to the first sensing electrode and a negative voltage source connected to the second sensing electrode.

7. The acceleration sensing unit of claim 1 wherein each of the contact elements for each sensing electrode extend inwardly from the rest of the sensing electrodes.

8. The acceleration sensing unit of claim 1 wherein the height of the mount, cantilever beam, proof mass, sensing electrodes and test electrodes above the substrate is 500 µm or less.

9. The acceleration sensing unit of claim 1 further including gold plating on the proof mass and the contact elements with which the proof mass makes electrical contact.

10. A micromachined shock sensor comprising:
    (a) a substrate having a surface;
    (b) an array comprised of a plurality of acceleration sensing units formed on the substrate, each sensing unit comprising:
       (1) a mount fixed to the substrate;
       (2) a cantilever beam extending from the mount over the substrate surface and free to bend in a plane above the substrate surface;
       (3) a proof mass fixed to the cantilever beam and supported by the cantilever beam above the surface of the substrate to permit translation of the proof mass and bending of the cantilever beam in a plane parallel to the substrate surface, the mount, cantilever beam and proof mass being electrically conductive and in electrical contact;
       (4) first and second sensing electrodes formed on the substrate on opposite sides of the proof mass and adjacent to the proof mass and having contact elements thereof spaced by a sensing gap from the proof mass such that displacements of the proof mass in response to accelerations brings the proof mass into contact with one or the other of the contact elements of the electrodes at a sufficient acceleration level;
    wherein a plurality of the sensing units have cantilever beam dimensions and proof mass dimensions selected to provide contact between the proof mass and the adjacent sensing electrodes at different levels of acceleration; and
    (c) an electrical conductor formed on the substrate electrically connected to all of the first sensing electrodes, and an electrical conductor formed on the substrate electrically connected to all of the second sensing electrodes.

11. The shock sensor of claim 10 wherein each acceleration sensing unit further comprises a test electrode formed on the substrate adjacent to the proof mass on one side thereof and adjacent to the first sensing electrode such that application of a voltage between the test electrode and the proof mass draws the proof mass toward the test electrode until at a sufficient voltage the proof mass contacts the first sensing electrode, the test electrodes electrically connected to the second sensing electrode.

12. The shock sensor of claim 10 wherein the mount, cantilever beam, proof mass, sensing electrodes, and test electrode for each acceleration sensing unit are formed on the substrate surface of electroplated metal.

13. The shock sensor of claim 10 wherein the mount, cantilever beam and proof mass are integrally formed together.

14. The shock sensor of claim 13 wherein the cantilever beam and proof mass for each acceleration sensing unit have the same height.

15. The shock sensor of claim 10 wherein the cantilever beam and proof mass together have a total length of 2500 µm or less for each acceleration sensing unit.

16. The shock sensor of claim 10 including a positive voltage source connected to the conductor connected to the first sensing electrode and a negative voltage source connected to the conductor connected to the second sensing electrodes.

17. The shock sensor of claim 10 wherein each of the contact elements for each sensing electrode of the acceleration sensing units extend inwardly from the rest of the sensing electrode.

18. The shock sensor of claim 10 wherein there are at least four acceleration sensing units which have cantilever beam dimensions and proof mass dimensions selected to provide contact between the proof mass and the adjacent sensing electrodes at different levels of acceleration.

19. The shock sensor of claim 10 further including gold plating on the proof mass and the contact elements with which the proof mass makes electrical contact.

20. The shock sensor of claim 10 wherein the height of the mounts, cantilever beams, proof masses and sensing electrodes above the substrate is 500 µm or less.

21. The shock sensor of claim 10 wherein the area of the array on the substrate surface is one square centimeter or less.

22. A micromachined shock sensor comprising:

(a) a substrate having a surface;

(b) an array comprised of a plurality of acceleration sensing units formed on the substrate, each sensing unit comprising:

(1) a mount fixed to the substrate;

(2) a cantilever beam extending from the mount over the substrate surface and free to bend in a plane above the substrate surface;

(3) a proof mass fixed to the cantilever beam and supported by the cantilever beam above the surface of the substrate to permit translation of the proof mass and bending of the cantilever beam in a plane parallel to the substrate surface, the mount, cantilever beam and proof mass being electrically conductive and in electrical contact;

(4) at least one sensing electrode formed on the substrate adjacent to the proof mass and having a contact element thereof spaced by a sensing gap from the proof mass such that displacements of the proof mass in response to accelerations brings the proof mass into contact with the contact element of the electrode at a sufficient acceleration level;

(5) a test electrode formed on the substrate adjacent to the proof mass on one side thereof and adjacent to the sensing electrode such that application of a voltage between the test electrode and the proof mass draws the proof mass toward the test electrode until at a sufficient voltage the proof mass contacts the sensing electrode;

wherein a plurality of the sensing units have cantilever beam dimensions and proof mass dimensions selected to provide contact between the proof mass and the adjacent sensing electrode at different levels of acceleration; and (c) an electrical conductor formed on the substrate electrically connected to all of the sensing electrodes.

23. The shock sensor of claim 22 wherein the mount, cantilever beam, proof mass, sensing electrode, and test electrode for each acceleration sensing unit are formed on the substrate surface of electroplated metal.

24. The shock sensor of claim 22 wherein the mount, cantilever beam and proof mass are integrally formed together.

25. The shock sensor of claim 22 wherein the contact element for the sensing electrode of each of the acceleration sensing units extends inwardly from the rest of the sensing electrode.

26. The shock sensor of claim 22 wherein there are at least four acceleration sensing units which have cantilever beam dimensions and proof mass dimensions selected to provide contact between the proof mass and the adjacent sensing electrodes at different levels of acceleration.

27. The shock sensor of claim 22 further including gold plating on the proof mass and the contact elements with which the proof mass makes electrical contact.

28. The shock sensor of claim 22 wherein the height of the mounts, cantilever beams, proof masses and sensing electrodes above the substrate is 500 $\mu$m or less.

29. The shock sensor of claim 22 wherein the area of the array on the substrate surface is one square centimeter or less.

* * * * *